(12) United States Patent
Steigerwald et al.

(10) Patent No.: US 6,946,685 B1
(45) Date of Patent: Sep. 20, 2005

(54) LIGHT EMITTING SEMICONDUCTOR METHOD AND DEVICE

(75) Inventors: Daniel A. Steigerwald, Cupertino, CA (US); Michael J. Ludowise, San Jose, CA (US); Steven A. Maranowski, San Jose, CA (US); Serge L. Rudaz, Sunnyvale, CA (US); Jerome C. Bhat, San Jose, CA (US)

(73) Assignee: Lumileds Lighting U.S., LLC, San Jose, CA (US)

( * ) Notice: Subject to any disclaimer, the term of this patent is extended or adjusted under 35 U.S.C. 154(b) by 419 days.

(21) Appl. No.: 09/652,194

(22) Filed: Aug. 31, 2000

(51) Int. Cl.$^7$ .............................. H01L 29/22
(52) U.S. Cl. ..................... 257/94; 257/96; 257/488; 257/745
(58) Field of Search ............... 257/94, 96, 97, 257/98, 99, 103, 488, 745

(56) References Cited

U.S. PATENT DOCUMENTS

| | | | |
|---|---|---|---|
| 4,153,905 A | 5/1979 | Charmakadze et al. ....... | 357/16 |
| 4,210,389 A | 7/1980 | Burkhart et al. ............ | 350/321 |
| 4,347,655 A | 9/1982 | Zory et al. .................... | 29/589 |
| 4,817,854 A | 4/1989 | Tihanyi et al. .............. | 228/124 |
| 4,990,970 A | 2/1991 | Fuller ........................... | 357/17 |
| 5,055,893 A | 10/1991 | Sasagawa .................... | 357/17 |
| 5,132,750 A | 7/1992 | Kato et al. ................... | 357/17 |
| 5,237,581 A | 8/1993 | Asada et al. ................. | 372/45 |
| 5,414,281 A | 5/1995 | Watabe et al. ............... | 257/95 |
| 5,460,911 A | 10/1995 | Yu et al. ....................... | 430/64 |
| 5,537,433 A | 7/1996 | Watanabe .................... | 372/45 |
| 5,563,422 A | 10/1996 | Nakamura et al. .......... | 257/13 |
| 5,760,479 A | 6/1998 | Yang et al. .................. | 257/778 |
| 5,854,087 A | 12/1998 | Kurata ......................... | 438/26 |
| 5,917,202 A | 6/1999 | Haitz et al. .................. | 257/98 |
| 6,091,085 A | 7/2000 | Lester ........................... | 257/98 |
| 6,111,272 A | 8/2000 | Heinen ......................... | 257/94 |
| 6,194,743 B1 * | 2/2001 | Kondoh et al. .............. | 257/94 |
| 6,222,207 B1 * | 4/2001 | Carter-Coman et al. ...... | 257/98 |

FOREIGN PATENT DOCUMENTS

| | | |
|---|---|---|
| DE | 37 25 454 A1 | 2/1989 |
| DE | 195 37 545 A1 | 4/1997 |
| DE | 196 48 309 A1 | 7/1997 |
| DE | 19921987 A1 | 5/1999 |
| EP | 0 905 797 A2 | 3/1999 |
| EP | 0926744 A2 | 6/1999 |
| WO | WO96/09653 | 3/1996 |

OTHER PUBLICATIONS

G.E. Höfler et al., "High–flux high–efficency transparent–substrate AlGaInP/GaP light–emitting diodes", Electronics Letters, $3^{rd}$ Sep. 1998, vol. 34, No. 18, pp. 1–2.

J.J. Steppan et al., "A Review Of Corrosion Failure Mechanisms During Accelerated Tests", vol. 134, No. 1, Jan. 1987.

Mensz et al., Electronic Letters 33 (24) pp. 2066–2068, 1997.

K.D. Hobart et al., J. Electrochem. Soc. 146, 3833–3836, 1999.

* cited by examiner

*Primary Examiner*—Sara Crane
(74) *Attorney, Agent, or Firm*—Patent Law Group LLP

(57) ABSTRACT

Silver electrode metallization in light emitting devices is subject to electrochemical migration in the presence of moisture and an electric field. Electrochemical migration of the silver metallization to the pn junction of the device results in an alternate shunt path across the junction, which degrades efficiency of the device. In accordance with a form of this invention, a migration barrier is provided for preventing migration of metal from at least one of the electrodes onto the surface of the semiconductor layer with which the electrode is in contact.

35 Claims, 6 Drawing Sheets

LIGHT EMITTING SEMICONDUCTOR METHOD AND DEVICE

RELATED APPLICATION

The subject matter of this application is generally related to subject matter disclosed in copending U.S. patent application Ser. No. 09/652,544, filed of even date herewith and assigned to the same assignee as the present application.

FIELD OF THE INVENTION

This invention relates to light emitting semiconductor structures and methods of making same and, more particularly, to devices and methods employing III–V nitride semiconductors and to improving the operation thereof.

BACKGROUND OF THE INVENTION

Light emitting semiconductors which emit in several regions of the visible spectrum, for example group III–V semiconductors such as aluminum gallium arsenide and gallium phosphide, have achieved commercial acceptance for various applications. However, for applications which require blue or green light, for example green to be used for traffic signal lights or blue for a component of a red-green-blue primary color combination to be used for white lighting, efficient semiconductor light emitters have been sought for shorter visible wavelengths. If such solid state light emitting sources were available at reasonable cost, many lighting applications could benefit from the reliability and low energy consumption that characterize semiconductor operation. Short wavelength devices also hold promise of providing increased storage capacity on storage media, due to the ability to obtain smaller spot sizes for writing and reading on the media.

Blue light-emitting diodes utilizing silicon carbide were developed during the early 1990's, but exhibited indirect bandgap luminance which limited the practicality of the devices. Zinc selenide, a group II–VI material, also produces blue light emission. Also, silicon carbide devices, as well as zinc selenide blue light emitting diodes, have been found to exhibit relatively short lifetimes that limit their usefulness.

A type of short wavelength light emitting devices that has direct energy bandgap, and has shown excellent promise, is based on group III–V nitride semiconductors, which include substances such as GaN, AlN, InN, AlInN, GaInN, AlGaN, AlInGaN, BAlN, BInN, BGaN, and BAlGaInN, among others. An example of a light emitting device of this type is set forth in European Patent Publication EP 0926744, which discloses a light emitting device that has an active region between an n-type layer of III–V nitride semiconductor and a p-type layer of III–V nitride semiconductor.

An electrical potential applied across the n and p layers of the diode structure causes generation of photons at the active region by recombination of holes and electrons. The wall-plug efficiency of the light emitting diode (LED) structure is defined by the optical power emitted by the device per unit of electric power. To maximize efficiency, both the light generated per watt of drive power and the amount of light exiting from the LED in a useful direction are considered.

As noted in the referenced EP Patent Publication, a considerable effort has been expended in prior art approaches to maximize the light that is generated from the active region. The resistance of the p-type III–V nitride semiconductor layer is much higher than the resistance of the n-type III–V nitride semiconductor layer. The p-electrode junction with the p-type layer is inherently more resistive than the n-electrode junction with the n-type layer. To reduce the voltage drop across the p-electrode junction with p-type layer, the p-electrode is generally made much larger than the n-electrode. However, although this increase in size of the p-electrode may increase the amount of light available from the active region, it can decrease the fraction of light that exits the device, since much of the light must pass through the p-electrode. Accordingly, attempts were made to maximize the transmittance of the p-electrode.

In an embodiment disclosed in the above referenced EP Publication, the p-layer can be a layer of silver that is sufficiently thin to be transparent. It is noted that silver advantageously forms an ohmic contact at the p-type III–V nitride semiconductor layers. A metal bonding pad is deposited on the silver electrode. In another embodiment disclosed in the referenced EP Patent Publication, the silver layer is thick enough to reflect most of the light incident thereon, and light exits via the substrate. A fixation layer, such as another metal layer, which can be nickel, can be applied over and on the sides, of the silver layer, and prevents the diffusion of the metal (e.g. gold) of the contact bonding pad into the silver layer. The diffusion barrier layer is also stated to improve the stability underlying silver layer and improve the mechanical and electrical characteristics of the silver layer. As a result, it is stated that the substrate temperature during the vapor deposition step in which the silver layer is formed can be lowered and the vapor deposition speed increased.

The use of silver for at least the p-electrode in a III–V nitrides LED has advantages, but also suffers certain drawbacks and limitations. For example, the operational lifetime of such devices, before severe degradation of performance, has been found to be unacceptably short. It is among the objects of the present invention to address these drawbacks and limitations in existing III–V nitride LEDs.

SUMMARY OF THE INVENTION

In the copending U.S. patent application Ser. No. 09/151, 554, filed Sep. 11, 1998, and entitled "Light Emitting Device Having A Finely-Patterned Reflective Contact", it is noted that the internally-reflected light in AlInGaN LEDs is particularly susceptible to absorption by the p-layer contact. This contact must cover essentially the entire p-n junction emitting area because current cannot spread laterally in the semiconductor layers. Since the conductivity of the p-type epitaxial layers is extremely low, current is confined directly under the contact metal or to within about 1 um of the contact edge. In devices disclosed in the copending U.S. Application referenced in this paragraph, the p-contact (that is, the electrode coupled to the p-type layer of III–V nitride semiconductor) comprises a metal layer, or multiple metal layers, having a pattern of small openings. The metal or metals used are preferably selected from the group consisting of silver, aluminum, and rhodium, and alloys thereof. An illustrated electrode or contact is a perforated silver mesh obtained by etching a pattern of holes in a silver layer. An optional dielectric encapsulant, preferably having an index of refraction greater than 1.5, such as silicon dioxide, silicon nitride, aluminum nitride, aluminum oxide, hafnium oxide, or titanium oxide, may be deposited over the p-contact. The encapsulant allows light to be reflected internally above rather than below the silver mirror, which increases its chance for escape without attenuation. In addition, the encapsulant improves the adhesion of the silver film to the LED surface by tacking down the metal at the open spaces across the surface. The dielectric also protects the metal layer from scratches that may occur during fabrication, and protects it from environmental degradation such as oxidation or tarnishing. Typically, in the prior art, LED's were designed, when using opaque contacts (or contact pads), to have the contacts be as small as possible to minimize obscuration of the surface of the LED. In the invention of the copending U.S. Application referenced in this paragraph, the finely patterned electrode can cover the entire surface, or as much thereof as desired, and also can be made as thick as necessary, both of these characteristics serving to minimize contact resistance. As also stated in the referenced copending U.S. Application, light can escape through the small openings in the silver electrode, either directly or after one or more reflections. Use of the small openings is not necessarily preferred at present.

Applicants have noted that the silver electrode metallization is subject to electrochemical migration in the presence of moisture and an electric field, such as, for example, the field developed as a result of applying an operating voltage at the contacts of the device. Electrochemical migration of the silver metallization to the pn junction of the device results in an alternate shunt path across the junction, which degrades efficiency of the device.

In accordance with a form of the invention, there is defined a light-emitting device which comprises a semiconductor structure having a plurality of semiconductor layers and including an active region within the layers. First and second conductive metal electrodes contact respectively different semiconductor layers of the structure. A migration barrier is provided for preventing migration of metal from at least one of said electrodes onto the surface of the semiconductor layer with which said at least one electrode is in contact.

In one preferred embodiment of the invention, there is defined a light emitting device which comprises a semiconductor structure that includes a light-emitting active region between an n-type layer of III–V nitride semiconductor and a p-type layer of III–V nitride semiconductor. A p-electrode comprising silver metal is deposited on the p-type layer, and an n-electrode is coupled with the n-type layer. Means are provided by which electrical signals can be applied across said electrodes to cause light emission from the active region, and a migration barrier is provided for preventing electrochemical migration of silver metal from the p-electrode toward the active region.

In disclosed embodiments, the migration barrier comprises a guard ring the periphery of the p-electrode or a guard sheet covering the p-electrode. The guard ring or guard sheet preferably comprises a conductive material such as a conductive metal or semiconductor that is not susceptible to electrochemical migration under pertinent conditions.

Further features and advantages of the invention will become more readily apparent from the following detailed description when taken in conjunction with the accompanying drawings.

DETAILED DESCRIPTION

Figure 1:
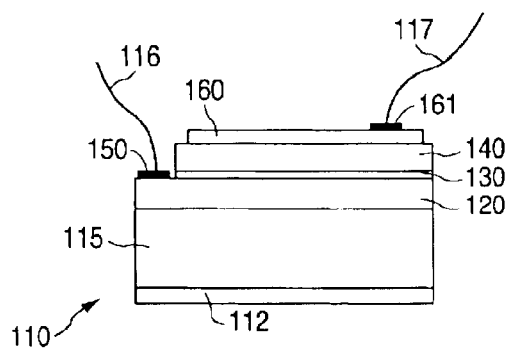
FIG. 1 is a cross-sectional view of a device of the type set forth in the copending U.S. patent application Ser. No. 09/151,554, and in which improvements in accordance with embodiments of the invention can be implemented.

FIG. 1 illustrates a III–V nitride light emitting diode (LED) 110 that includes a bottom reflective layer 112, a substrate 115, which may be for example a sapphire, SiC, or GaN substrate, an n-type layer 120 of a III–V nitride semiconductor for example n-type GaN, and a p-type layer 140 of a III–V nitride semiconductor for example p-type GaN. The active region 130 can be the p-n junction itself or, more typically, a single quantum well or multiple quantum wells of III–V nitride between barrier layers of another III–V nitride, for example using InGaN and AlGaN. It will be understood that any suitable III–V nitride semiconductors can be used for any of the semiconductor layers of the device, and that suitable additional semiconductor layers can be employed in the device. A conductive metal electrode 150 (the n-electrode) is deposited on the n-type layer 120 and a conductive metal electrode 160 (the p-electrode) is deposited on the p-type layer 140. As first noted above, the p-electrode conventionally is of much larger area than the n-electrode. As described in the above-referenced copending U.S. patent application Ser. No. 09/151,554, the p-electrode 160 and the reflector 112 can comprise silver metal, which has advantageous electrically conductive and light reflective properties, and can form an ohmic contact with the p-type layer 140. The silver electrode 160 can comprise a silver mesh with a pattern of openings, as described in the above-referenced copending Application. The finely patterned electrode can cover the entire surface of the p-layer, or as much thereof as desired, and can be made as thick as necessary (both of these characteristics serving to minimize contact resistance), and light can escape through the openings in the p-electrode, either directly or after one or more reflections. A contact pad 161 is deposited on the p-electrode to 160. Leads 116 and 117 are respectively attached to the electrode (or contact) 150 and the contact pad 116, and suitable electrical potentials can be applied across the leads.

Figure 2:
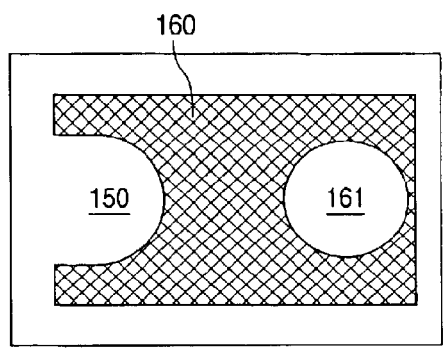
FIG. 2 is a top view, partially in plan form, of the FIG. 1 device.
Figure 3:
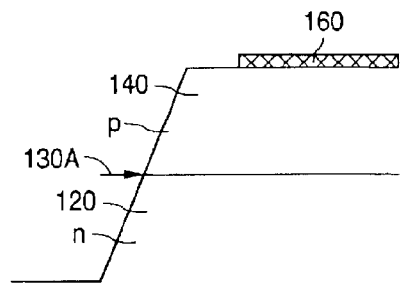
FIG. 3 is a simplified cross-section of the device of FIGS. 1 and 2.

FIG. 2 shows a top view of a device of the general type shown in FIG. 1, and FIG. 3 is a simplified cross-sectional view of part of the FIG. 2 device. In FIGS. 2 and 3, as above, the silver mesh p-electrode is labeled 160, the p-contact pad is labeled 161 (FIG. 2) and the n-electrode is labeled 150.

In FIG. 3, the p-type layer is again represented at 140, the n-type layer is again represented at 120, and the pn junction (where active region layers, not shown in this simplified diagram, can be located) is represented at 130A.

Applicants have noted that the silver electrode metallization is subject to electrochemical migration in the presence of moisture and an electric field, such as the field developed as a result of applying an operating voltage at the contacts of the device. Electrochemical migration of the silver metallization to the pn junction of the device results in an alternate shunt path across the junction, which degrades efficiency of the device.

Figure 4:
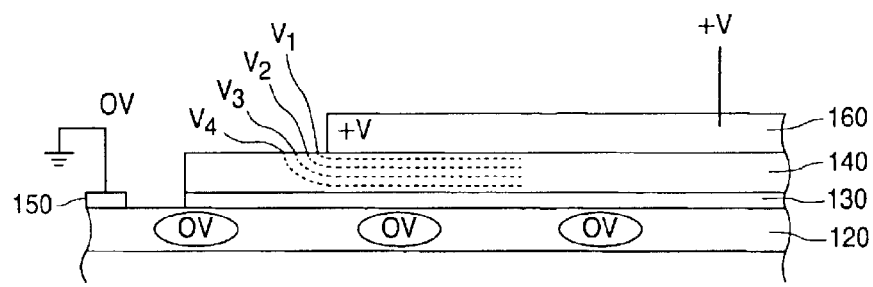
FIG. 4 is another simplified cross-sectional view that is useful in understanding a problem of electrochemical migration that is reduced or eliminated by the invention.

FIG. 4 illustrates the type of potential gradient that occurs adjacent an exemplary silver electrode 160 and causes migration of silver toward the pn junction. Assume, for example, that the n-contact 150 to an exemplary n-type layer 120 (n-type GaN in this example) is at ground potential and that an exemplary p-electrode layer 160 (silver, in this case) is at a potential +V. The equipotential surfaces (seen as lines in the cross-section of FIG. 4) in the exemplary p-type layer 140 (p-type GaN, in this example, which generally has much higher resistivity than n-type GaN), are shown in the Figure as being at potentials $V_1, V_2, V_3, \ldots$, where $$V > V_1 > V_2 > V_3 \ldots$$

Accordingly, the dissolved silver cations, under the influence of this potential gradient, migrate along the surface of the layer 140 and toward the pn junction (at which exemplary active region 130 is located in this example), where it can provide a shunt path that deteriorates device operation.

Figure 5:
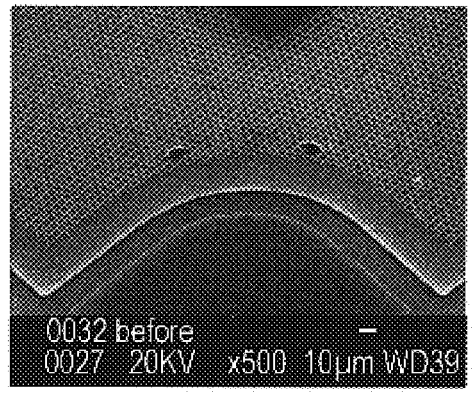
FIGS. 5 and 6 are scanning electron microscope (SEM) photographs of an edge of the device of FIGS. 1 and 2, before stress testing, showing the mesh metallization and the junction, and wherein it can be seen that silver metal has not migrated toward the pn junction.
Figure 6:
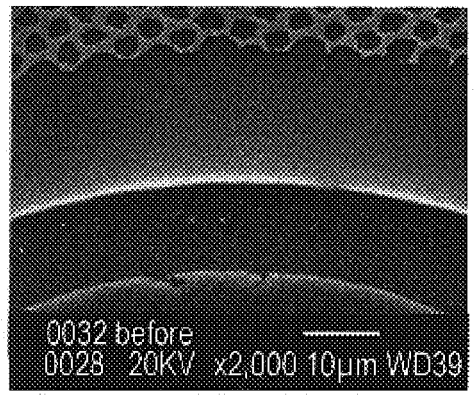
Figure 7:
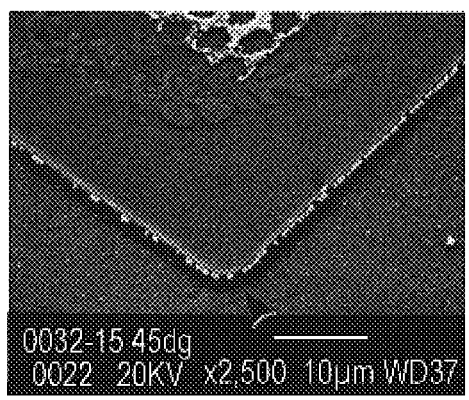
FIGS. 7 and 8 are SEM photographs of a corner of the device of FIGS. 1 and 2 after the stress of accelerated reliability testing, which show the migration of silver to the pn junction.
Figure 8:
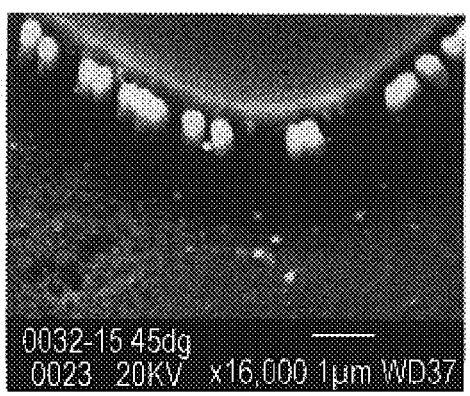
Figure 9:
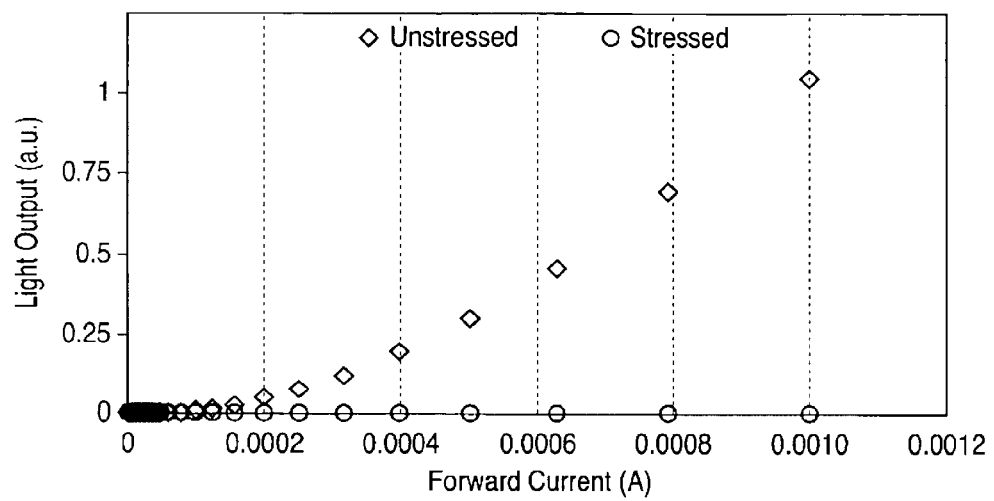
FIG. 9 is a graph of light output versus forward current for a device before and after stressing, illustrating the deterioration of light output for the device which suffered the electrochemical migration of silver to the pn junction due to the stress of the accelerated reliability testing.
Figure 10:
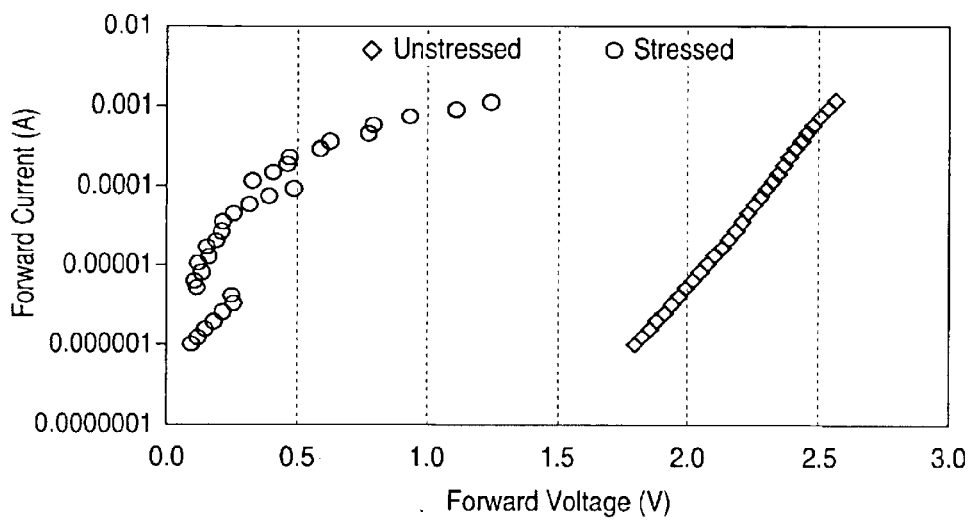
FIG. 10 is a graph of current versus voltage for a device before and after stressing, illustrating the collapse of the I–V curve for the device after the stress of testing.

The loss of efficiency caused by the metal migration is demonstrated in FIGS. 5 through 10. FIGS. 5 and 6 are SEM photographs of a device of the type diagramed in FIG. 2, prior to accelerated reliability testing. FIG. 5 shows at, ×500 magnification, from top to bottom, the silver mesh electrode, the p-type layer, the pn junction (curved heavy white line), and the n-type layer. FIG. 6 is a similar SEM photograph at higher magnification (×2000). In these photographs, no migration of silver to the pn junction is evident. FIGS. 7 and 8 are SEM photographs (at ×2,500 and ×16,000 magnifications, respectively) of a similar light emitting diode device after accelerated reliability testing under conditions of 85 degrees C., 85% RH, at 20 mA DC. Silver migration was confirmed by EDX, showing silver droplets (bright spots) forming at the pn junction. FIG. 9 is a graph of light output (L) as a function of forward current (I) for the devices of FIGS. 5, 6 (before accelerated reliability testing—square shaped points in the FIG. 9 graph) and FIGS. 7, 8 (after accelerated reliability testing—circular shaped points in the FIG. 9 graph). The substantial loss of measurable light output for the device exhibiting electrochemical migration (after the indicated stressed testing) is indicative of the shunting of the pn junction. FIG. 10 shows forward bias IV curves (using the same graph point symbols for the respective device states; that is, square shaped points for before the stress of reliability testing, and circular shaped points for after the stress of the testing) which demonstrate collapse of the I–V curve for the stressed device, indicative of an alternate conduction path shunting the pn junction.

Figure 11:
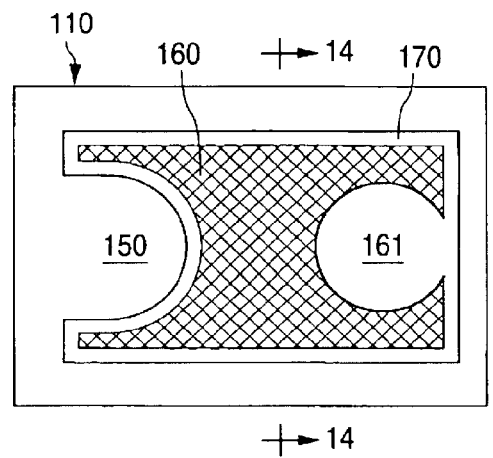
FIG. 11 is a top view, partially in plan form, of a device including the improvement of an embodiment of the invention.
Figure 12:
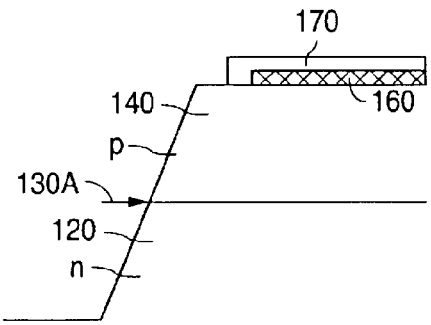
FIG. 12 shows a simplified cross-sectional view of the FIG. 11 device.

FIGS. 11 and 12 illustrate an embodiment of the invention that employs a migration barrier to prevent migration of the electrode metal, (silver, in this embodiment) toward the pn junction. In the embodiment of FIGS. 11 and 12, in which like reference numerals represent elements corresponding to those of FIGS. 2 and 3, respectively, the migration barrier is a guard ring 170 formed around the periphery of the p-electrode 160. The guard ring is preferably a material of high electrical conductivity, such as a conductive metal. As seen in FIGS. 11 and 12, the guard ring 170 preferably surrounds the entire periphery of the electrode.

Figure 13:
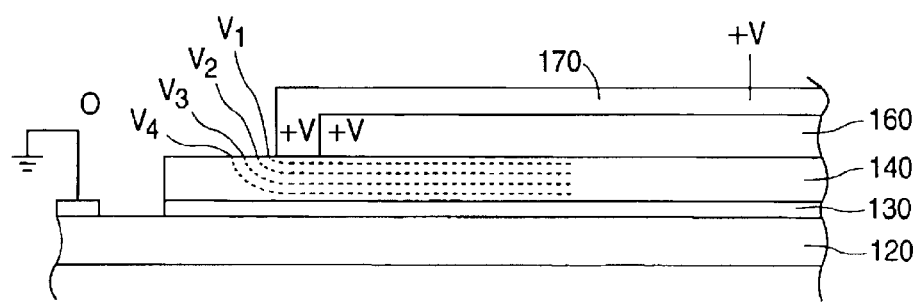
FIG. 13 is a simplified cross-section of the device of FIG. 11 or FIG. 12, useful in understanding how the improvement of the invention operates to reduce or eliminate electrochemical migration of silver metal.

FIG. 13 illustrates how the migration barrier of embodiments hereof, in the form of a conductive guard ring and/or guard sheet, operates to prevent the deleterious migration of metal along the surface of the p-type layer 140 and toward the active region at the pn junction. As shown in FIG. 13, at least the edge of the silver p-electrode 160, along the line where its periphery contacts the p-layer 140, is surrounded by the guard ring 170. As seen in the Figure, in this example (as in the FIG. 4 example) the p-electrode is again at a potential +V, so the conductive metal guard ring will also be at the potential +V. Again, the equipotential surfaces (lines in the cross-sectional Figure) are shown as being at potentials $V_1, V_2, V_3 \ldots$ where $$V > V_1 > V_2 > V_3 \ldots$$

In this case, the surface of p-type layer 160 around the periphery of silver electrode 160 (and under the guard ring 170) will be at substantially the potential +V, and there will be little, if any, potential gradient at the edge of the silver electrode 160 that could cause silver to migrate along the surface of the p-layer and toward the pn junction of the device.

In general, any highly conductive material may be used as a guard ring or as a guard sheet (to be described). For example, the metals, Ni, Ti, W, Al Cr, Cu, Au, S, Rh, Re, Ru, or combinations or alloys thereof, may be used. In addition, certain stable conducting and semiconducting compounds may be used, for example the metal suicides, metal nitrides, or highly doped semiconductors. In general, the properties needed are (1) adherence to the silver and the p-type III–V nitride semiconductor; (2) sufficient conductivity to nullify the electrical field at the silver boundary; (3) a compatible method of deposition; (4) a compatible method of patterning the material; (5) absence of electrochemical migration for the selected material in the presence of an electrical field in a moist environment; and (6) controlled mutual solubility and reactivity with respect to the silver. It will be understood that the listed materials are exemplary, and that other suitable materials can be used.

Figure 14:
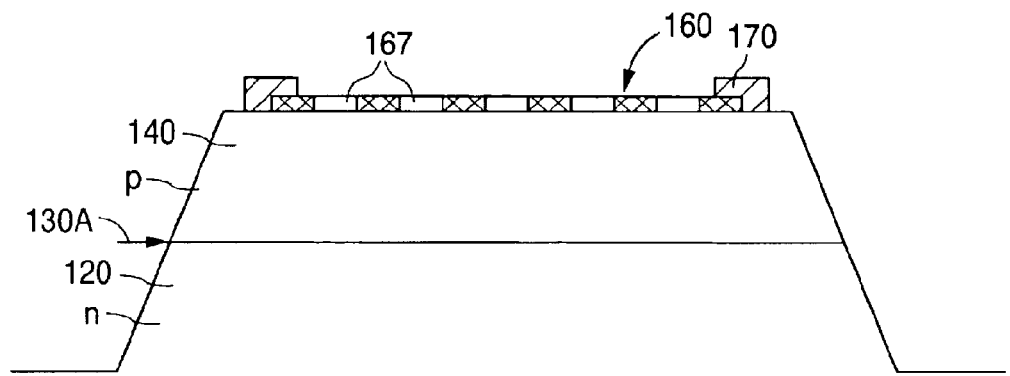
FIG. 14 is another simplified cross sectional view of a device with a mesh electrode, showing how a guard ring in accordance with an embodiment of the invention can be employed.

FIG. 14 shows a simplified cross-sectional view taken through a section defined by arrows 14—14 of FIG. 11, and including illustration of a pattern of openings 167 in the p-electrode, as described in the above-referenced copending U.S. patent application Ser. No. 09/151,554. The metal guard ring 170 is seen to be configured such that the transmissivity through the openings of the electrode is unaffected.

Figure 15:
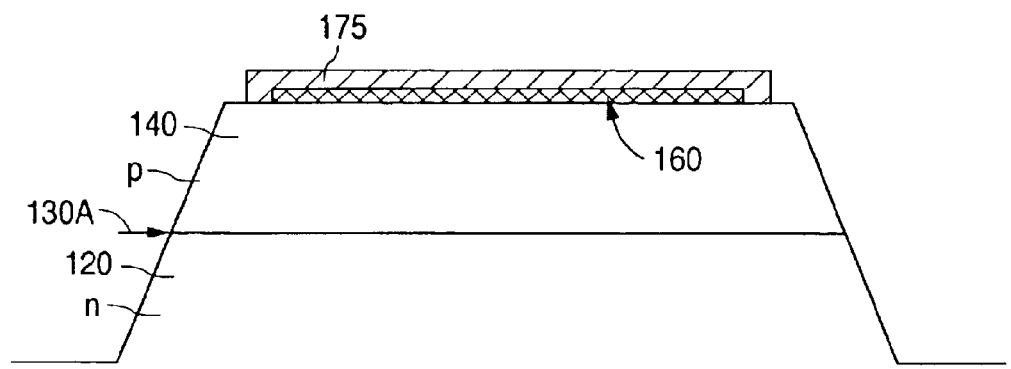
FIG. 15 illustrate another embodiment of the invention, employing a guard sheet.

FIG. 15 shows a further embodiment wherein the migration barrier is a conducting guard sheet 175. This type of configuration can be advantageously employed in applications where the p-electrode is opaque and light generated at the pn junction is extracted in other way(s) from the device, such as in so-called flip-chip or vertical LED types of structures. The guard sheet could also be employed in conjunction with a transparent, or partially transmissive p-electrode by providing an optically transmissive conductive guard sheet using, for example, indium tin oxide.

Other device geometries can employ the principles of the invention. Preferably, the guard ring or guard sheet conductor should encompass the silver thoroughly such that there is no surface electrical pathway from the pn junction to the silver that is not intercepted by the guard conductor. In other words, all the edges of the silver should preferably be covered by the guard conductor. A guard sheet should preferably cover the entirety of the underlying silver so as to provide a physical barrier to etchants and other substances from penetrating to and subsequently reacting with said silver layer during the operational life of the structure. In the case where the p-metal is intended to be opaque, then complete encapsulation of the silver by the guard conductor is the simplest and most effective (e.g. FIG. 15 or 16), although a guard ring geometry can also perform adequately. In the case where the p-metal is made to be optically transmissive to some extent, then the guard ring geometry is preferred unless the guard conductor is optically transparent at the wavelengths of interest. As above noted, a transparent guard sheet (indium tin oxide, for example) may be used.

The guard sheet may contain additional layers or materials which enhance electrical connections or device fabrication in other ways. For example, a layer of material that is chemically reactive with ionic silver species may be included. This reaction would form an insoluble immobile silver species from the ionic species. Other purposes for including additional layers may be to enhance connection to conductors, soldering to other substrates or chip mounting schemes, or interconnection of adjacent devices.

Figure 16:
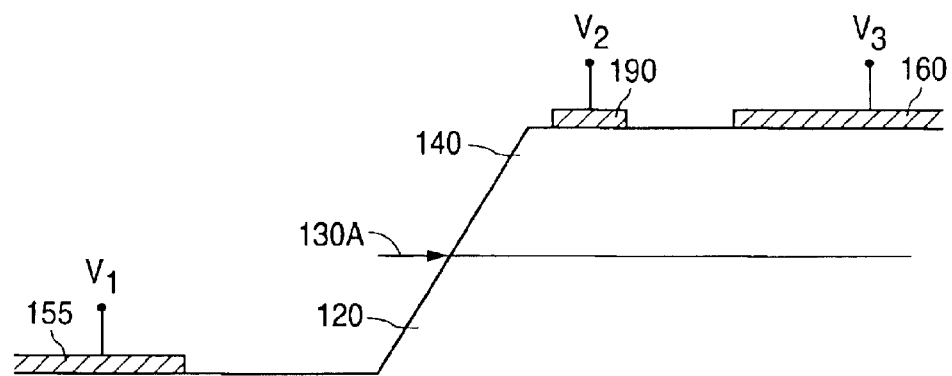
FIG. 16 shows a simplified cross sectional view of a device in accordance with a further embodiment of the invention.

FIG. 16 shows a further embodiment of the invention in which the migration barrier is held at a potential that tends to repulse ions back toward the p-electrode from which they would otherwise tend to migrate. The illustrated embodiment shows n-type layer 120 (n-type GaN, for example), p-type layer 140 (p-type GaN, for example), and active region 130 therebetween. The silver p-electrode is represented at 160 and the n-electrode is represented at 155. The migration barrier in this embodiment is a guard ring 190, spaced from the p-electrode, on the p-type layer 140. In this example, the p-electrode is at a voltage $V_3$, the n-electrode is at a voltage $V_1$, and the guard ring is at a voltage $V_2$, where $V_2 > V_3 > V_1$. By keeping the voltage $V_2$ slightly above $V_3$, an electric field is generated which tends to drive silver ions, that would otherwise tend to move toward the pn junction due to electrochemical migration, back toward the p-electrode.

The guard ring or guard sheet can also comprise a structure of multiple layers of conducting metals and semiconductors in combination with each other and in possible combination with dielectric interspersing layers which may incorporate vias through which electrical connection between conducting layers can be achieved.

The guard sheet hereof can also serve the purpose of encapsulating and protecting the silver. In addition to the metals already noted above, the following further materials are noted: titanium nitride, tungsten nitride, and nitrogenated titanium-tungsten alloy. These and other suitable materials can be deposited by techniques such as sputtering, evaporation, or chemical vapor deposition. Applicant has noted that coverage of the silver electrode "step" can become compromised by cracking, accentuated grain boundaries, or other material defects, especially adjacent the top edge of the silver electrode. This crack or other defect can provide a path through contaminants, and moisture can penetrate to the silver layer and react with it.

Figure 17:
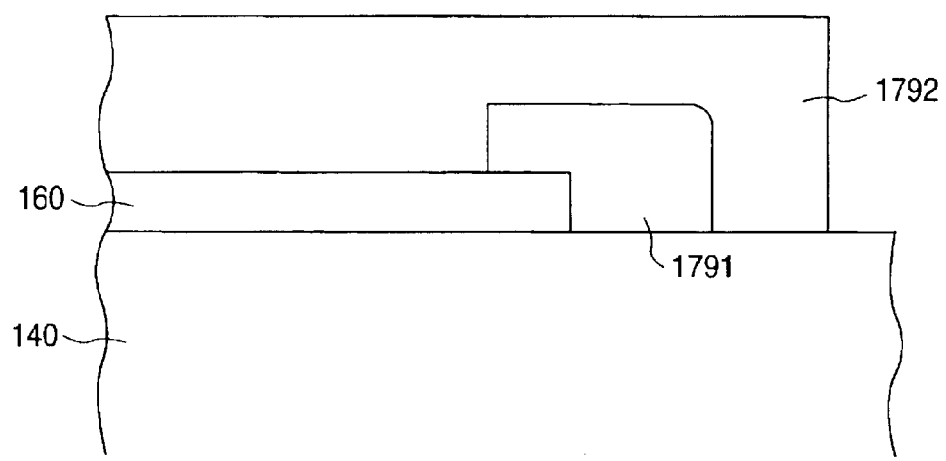
FIG. 17 shows a simplified cross-sectional view of a portion of a device in accordance with a still further embodiment of the invention.

The embodiment of FIG. 17 addresses and solves this problem. The Figure shows p-type layer 140 (p-type GaN, for example) with a silver p-electrode 160 thereon. An edge protector 1791 is deposited over the edge of the electrode, and the guard sheet (or ring) 1792 covers the edge protector and at least part of the electrode. Now, if a crack develops in the step of the outer guard sheet, it will not likely penetrate the edge protector. The edge protector does not have to be conducting so long as electrical connection can be made to the final deposited, conducting guard sheet. A material which deposits over the defined silver such that it covers the edge of the silver without cracking would preferentially be chosen. This edge protector is also preferably a material over which the final guard sheet can be deposited such that good step coverage of the guard sheet over the edges of the edge protector can be achieved. A suitable dielectric such as $Al_2O_3$ can be utilized for the edge protector.

The invention has been described with reference to particular preferred embodiments, but variations within the spirit and scope of the invention will occur to those skilled in the art. For example, while the illustrated embodiments dealt with effects at the p-electrode, it will be understood that the migration barrier of the present invention can be utilized for protection at the n-electrode against effects including electrochemical migration of negative ionic species.

What is claimed is:

1. A light-emitting device, comprising:

a semiconductor structure having a plurality of semiconductor layers and including an active region within said layers;

first and second conductive metal electrodes contacting respectively different semiconductor layers of said structure, the first and second conductive metal electrodes being disposed on a same side of the structure; and a migration barrier for preventing migration of metal from at least one of said electrodes onto the surface of the semiconductor layer with which said at least one electrode is in contact;

wherein said migration barrier comprises at least one of Ti and W.

2. The device as defined by claim 1, wherein said at least one electrode comprises a silver-containing electrode.

3. The device as defined by claim 1, wherein said device further includes means for applying electrical signals across said first and second electrodes, and wherein said migration barrier is operative to prevent electrochemical migration of metal from said at least one electrode on said surface of the semiconductor layer with which said electrode is in contact.

4. The device as defined by claim 1, wherein said device further includes means for applying electrical signals across said first and second electrodes, and wherein said migration barrier is operative to prevent electrochemical migration of metal from said at least one electrode on said surface of the semiconductor layer with which said electrode is in contact.

5. The device as defined by claim 1, wherein said plurality of semiconductor layers includes an n-type layer of a III–V nitride semiconductor and a p-type layer of a III–V nitride semiconductor, and wherein said at least one electrode is deposited on said p-type layer.

6. The device as defined by claim 4, wherein said plurality of semiconductor layers includes an n-type layer of a III–V nitride semiconductor and a p-type layer of a III–V nitride semiconductor, and wherein said at least one electrode is deposited on said p-type layer.

7. The device as defined by claim 5, wherein said device includes an active light-emitting region at the pn junction between said p-type layer and said n-type layer.

8. The device as defined by claim 6, wherein said device includes an active light-emitting region at the pn junction between said p-type layer and said n-type layer.

9. The device as defined by claim 1, wherein said migration barrier comprise a guard ring around the periphery of said at least one electrode.

10. The device as defined by claim 4, wherein said migration barrier comprises a guard ring around the periphery of said at least one electrode.

11. The device as defined by claim 9, wherein said guard ring contacts said at least one electrode.

12. A light-emitting device, comprising:
a semiconductor structure having a plurality of semiconductor layers and including an active region within said layers;
first and second conductive metal electrodes contacting respectively different semiconductor layers of said structure; and
a migration barrier for preventing migration of metal from at least one of said electrodes onto the surface of the semiconductor layer with which said at least one electrode is in contact;
wherein said migration barrier comprises a guard ring spaced from said at least one electrode.

13. The device as defined by claim 12, wherein said guard ring is held at a positive potential with respect to the potential of said at least one electrode.

14. The device as defined by claim 11, wherein said guard ring covers a portion of said surface of the semiconductor layer with which said at least one electrode is in contact.

15. The device as defined by claim 12, wherein said guard ring covers a portion of said surface of the semiconductor layer with which said at least one electrode is in contact.

16. The device as defined by claim 11, wherein said guard ring has a substantially step-shaped cross-section, and also covers the edge of said at least one electrode.

17. The device as defined by claim 1, wherein said migration barrier comprises a guard sheet that covers the surface of said at least one electrode.

18. The device as defined by claim 12, wherein said guard ring comprises a conductive material.

19. The device as defined by claim 17, wherein said guard sheet comprises a conductive material.

20. The device as defined by claim 18, wherein said conductive material is a conductive metal.

21. The device as defined by claim 20, wherein said conductive metal comprises a metal containing at least one of Ni, Ti, W, Al, Cr, Cu, Au, Sn, Rh, Re, Ru.

22. A light-emitting device, comprising:
a semiconductor structure having a plurality of semiconductor layers and including an active region within said layers;
first and second conductive metal electrodes contacting respectively different semiconductor layers of said structure; and
a migration barrier for preventing migration of metal from at least one of said electrodes onto the surface of the semiconductor layer with which said at least one electrode is in contact;
wherein said migration barrier comprises at least one of Al, Cr, Cu, Sn, Rh, Re, Ru.

23. A light-emitting device, comprising:
a semiconductor structure having a plurality of semiconductor layers and including an active region within said layers;
first and second conductive metal electrodes contacting respectively different semiconductor layers of said structure; and
a migration barrier for preventing migration of metal from at least one of said electrodes onto the surface of the semiconductor layer with which said at least one electrode is in contact;
wherein said migration barrier includes an edge protector portion comprising a dielectric material which covers an edge of said at least one electrode, and a conductive guard sheet that covets said edge protector portion and at least a portion of said at least one electrode.

24. A light emitting device, comprising:
a semiconductor structure that includes a light-emitting active region between an n-type layer of III–V nitride semiconductor and a p-type layer of III–V nitride semiconductor;
a p-electrode comprising silver-containing metal deposited on said p-type layer,
an n-electrode coupled with said n-type layer;
means by which electrical signals can be applied across said electrodes to cause light emission from the active region; and
a migration barrier for preventing electrochemical migration of silver ions from said p-electrode toward the active region, the migration barrier comprising at least one of Ti, W, Al, Cr. Cu, Sn, Rh, Re, Ru;
wherein the p- and n-electrodes are disposed on a same side of the structure.

25. The device as defined by claim 24, wherein said migration barrier comprises a guard ring around the periphery of said p-electrode.

26. The device as defined by claim 25, wherein said guard ring covers a portion of the p-type layer.

27. The device as defined by claim 25, wherein said guard ring contacts said p-electrode.

28. The device as defined by claim 25, wherein said guard ring is spaced from said p-electrode.

29. The device as defined by claim 28, wherein said guard ring is held at a positive potential with respect to the potential of said p-electrode.

30. The device as defined by claim 27, wherein said guard ring has a substantially step-shaped cross-section, and also covers the edge of said p-electrode.

31. The device as defined by claim 24, wherein said migration barrier comprises a guard sheet that covers the surface of said p-electrode.

32. The device as defined by claim 25, wherein said guard ring comprises a conductive material.

33. The device as defined by claim 31, wherein said guard sheet comprises a conductive material.

34. The device as defined by claim 32, wherein said conductive material is a conductive metal.

35. The device as defined by claim 33, wherein said conductive material is a conductive metal.

* * * * *

UNITED STATES PATENT AND TRADEMARK OFFICE
CERTIFICATE OF CORRECTION

PATENT NO. : 6,946,685 B1
DATED : September 20, 2005
INVENTOR(S) : Daniel A. Steigerwald et al.

It is certified that error appears in the above-identified patent and that said Letters Patent is hereby corrected as shown below:

Column 8,
Line 57, cancel "claim 1" and insert -- claim 12 --.

Column 10,
Line 36, cancel "Cr." and insert -- Cr, --.

Signed and Sealed this

Seventeenth Day of January, 2006

JON W. DUDAS
*Director of the United States Patent and Trademark Office*